United States Patent
Farquhar et al.

(10) Patent No.: US 10,675,838 B2
(45) Date of Patent: Jun. 9, 2020

(54) MOLDING PROCESSES FOR METALLIC FOAMS, APPARATUSES, AND PRODUCTS

(71) Applicant: Fourté International, Sdn. Bhd., Bayan Lepas (MY)

(72) Inventors: James J. Farquhar, Penang (MY); Darryl G. McBride, Penang (MY)

(73) Assignee: Fourté International, SDN. BHD, Bayan Lepas (MY)

( * ) Notice: Subject to any disclaimer, the term of this patent is extended or adjusted under 35 U.S.C. 154(b) by 150 days.

(21) Appl. No.: 15/825,408

(22) Filed: Nov. 29, 2017

(65) Prior Publication Data

US 2019/0160779 A1   May 30, 2019

(51) Int. Cl.
*B22D 17/24* (2006.01)
*B29C 45/14* (2006.01)
(Continued)

(52) U.S. Cl.
CPC ............... *B32B 5/18* (2013.01); *B22D 17/24* (2013.01); *B29C 45/14* (2013.01); *B29C 45/14262* (2013.01); *B29C 45/14795* (2013.01); *B32B 15/015* (2013.01); *B32B 15/043* (2013.01); *B32B 15/046* (2013.01); *B32B 15/08* (2013.01); *B32B 15/20* (2013.01); *B82Y 30/00* (2013.01); *C23C 16/045* (2013.01); *B29C 2045/14122* (2013.01); *B29C 2045/14803* (2013.01); *B29C 2045/667* (2013.01); *B32B 2266/045* (2013.01); *B32B 2309/12* (2013.01); *C22C 2001/085* (2013.01)

(58) Field of Classification Search
CPC ..... B22D 17/24; B29C 45/14; B29C 45/1418; B29C 45/14221; B29C 45/14262; B29C 45/14336; B29C 45/14795; B29C 45/14811; B29C 2045/14122; B29C 2045/14147; B29C 2045/14803; B29C 2045/1668; B29C 2045/667; B32B 5/18; B32B 15/01; B32B 15/043; B32B 15/046; B32B 15/08; B32B 15/20; B32B 2266/045
See application file for complete search history.

(56) References Cited

U.S. PATENT DOCUMENTS 4,239,571 A * 12/1980 Cobb ..................... B29C 44/10
                                                             156/196
2001/0038167 A1   11/2001 Brune
(Continued)

FOREIGN PATENT DOCUMENTS

WO   2017051383 A1   3/2017

*Primary Examiner* — Michael A Tolin
(74) *Attorney, Agent, or Firm* — Keith Kline; The Kline Law Firm PC

(57) ABSTRACT

Embodiments of the present technology include molding processes for metallic foams, apparatuses, and products. An example method includes placing an uncompressed charge of conductive metal foam into a cavity disposed on a first tool, wherein the first tool is located on a first portion of a compression mold apparatus, translating the first portion of the compression mold apparatus towards a second portion of the compression mold apparatus so as to compress the uncompressed charge of conductive metal foam, creating a compressed charge of conductive metal foam, and overmolding around and through the compressed charge of conductive metal foam with an overmolding material.

8 Claims, 19 Drawing Sheets

(51) Int. Cl.
   *B32B 5/18*     (2006.01)
   *B32B 15/20*    (2006.01)
   *B82Y 30/00*    (2011.01)
   *C23C 16/04*    (2006.01)
   *B32B 15/01*    (2006.01)
   *B32B 15/08*    (2006.01)
   *B32B 15/04*    (2006.01)
   *C22C 1/08*     (2006.01)
   *B29C 45/66*    (2006.01)

(56) References Cited

U.S. PATENT DOCUMENTS

| | | | |
|---|---|---|---|
| 2005/0208263 A1* | 9/2005 | Wilkens | B32B 27/12 |
| | | | 428/116 |
| 2008/0317950 A1 | 12/2008 | Berzon et al. | |
| 2011/0037198 A1 | 2/2011 | Polk, Jr. et al. | |
| 2011/0262701 A1* | 10/2011 | Albertelli | B29C 43/18 |
| | | | 428/147 |
| 2017/0173834 A1 | 6/2017 | Haupt | |

* cited by examiner

MOLDING PROCESSES FOR METALLIC FOAMS, APPARATUSES, AND PRODUCTS

CROSS-REFERENCE TO RELATED APPLICATIONS

This non-provisional application is related to U.S. application Ser. No. 14/876,733, filed on Oct. 6, 2015; U.S. application Ser. No. 14/947,951 filed on Nov. 20, 2015; and U.S. application Ser. No. 15/017,578, filed on Feb. 5, 2016, all of which are hereby incorporated by reference in their entireties, including all references and appendices cited therein, for all purposes.

FIELD OF THE PRESENT TECHNOLOGY

The present disclosure generally relates to molding process that incorporate metallic foams, and more particularly, but not by limitation to apparatuses and methods for incorporating metallic foams into products. These methods can include compression of the metallic foams to differing degrees. Methods and apparatus are also provided which allow for overmolding of the metallic foams to create overmolded products.

SUMMARY

Embodiments of the present technology include a method, comprising: placing an uncompressed charge of conductive metal foam into a cavity disposed on a first tool, wherein the first tool is located on a first portion of a compression mold apparatus; translating the first portion of the compression mold apparatus towards a second portion of the compression mold apparatus so as to compress the uncompressed charge of conductive metal foam, creating a compressed charge of conductive metal foam; and overmolding around and through the compressed charge of conductive metal foam with an overmolding material.

Other embodiments of the present technology include a system comprising: a first tool located on a first portion of a compression mold apparatus, the first tool receiving a charge of conductive metal foam; a second portion of the compression mold apparatus configured to interface with the first tool of the compression mold apparatus; means for translating the first portion of the compression mold apparatus toward the second portion of the compression mold apparatus so as to capture the charge of conductive metal foam therebetween in such a way that a space is created between the first tool and the second portion of the compression mold apparatus; and means for filing the space with an overmolding material that integrates the conductive metal foam into a overmolded product.

Some embodiments of the present technology include a method comprising: placing charge of conductive metal foam into a mold cavity of a core tool, wherein the core tool is located on a first portion of a compression mold apparatus, further wherein the mold cavity is defined by a lower surface that comprises a plurality of pinch pins; translating the lower portion of the compression mold apparatus into a second portion of the compression mold apparatus, the second portion comprising a second plurality of pinch pins that align with the plurality of pinch pins; wherein the second plurality of pinch pins and the plurality of pinch pins suspend the charge of conductive metal; and introducing an overmolding material into a space created by suspension of the charge of conductive metal, wherein the overmolding material saturates the charge of conductive metal foam.

DETAILED DESCRIPTION

Figure 1:
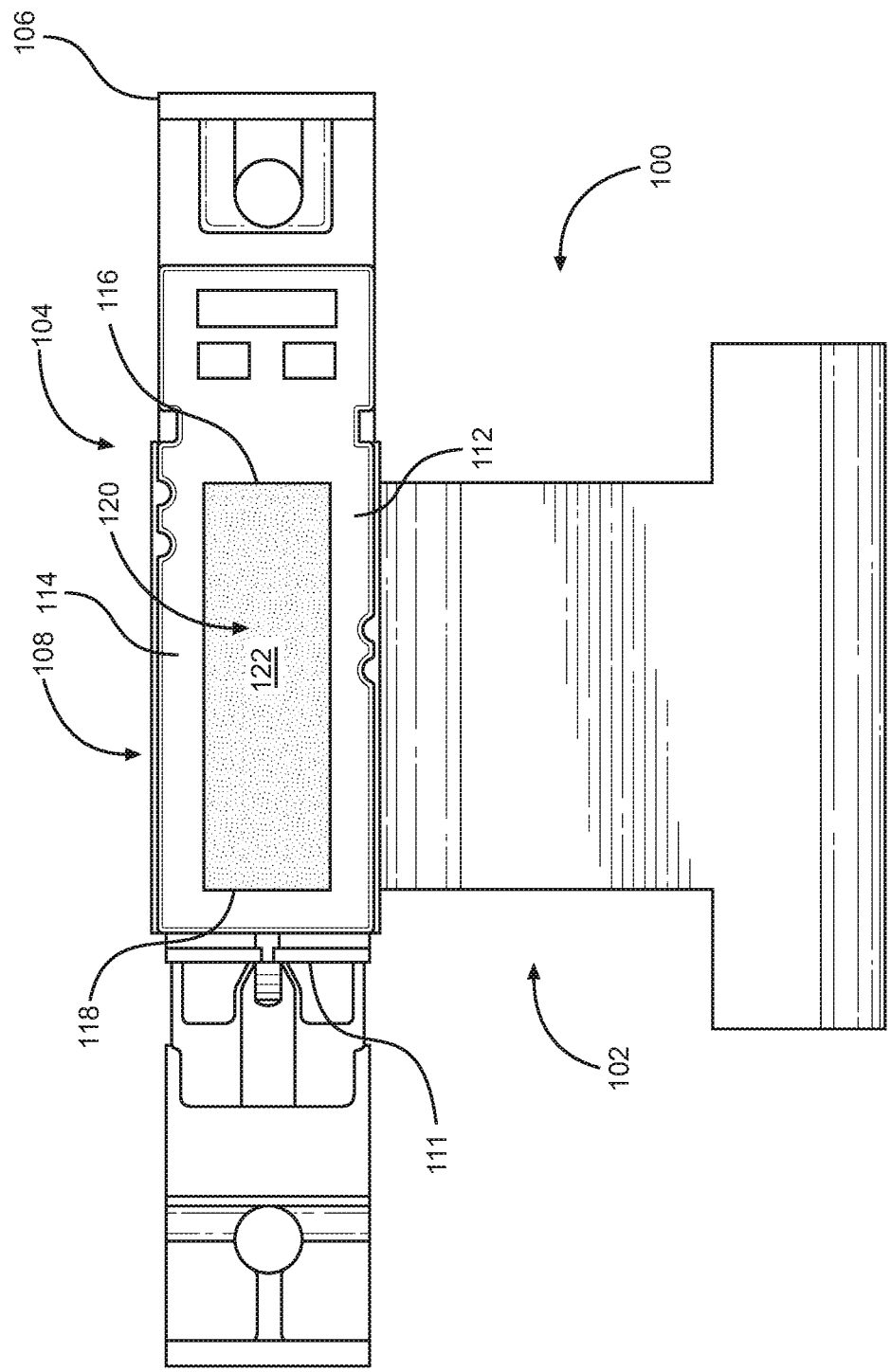
FIG. 1 is a top down perspective view of an example apparatus constructed in accordance with the present disclosure.

Generally described, the present disclosure includes descriptions of example embodiments of apparatuses and methods for incorporating metallic foams into molding processes. For example, an uncompressed conductive metal foam can be placed into to a molding press. The molding press applies a predetermined amount of pressure in order to compress the conductive metal foam into one or more states of compression. This compressed conductive metal foam can be then incorporated into a die cast part or product. In some embodiments, uncompressed and/or compressed conductive metal foams can be incorporated into a die cast part by way of overmolding with an overmolding material.

In addition to using hydraulic pressing, other methods such as stamping that are known to one of skill in the art are also contemplated for use in accordance with the present disclosure.

In some embodiments, an apparatus of the present disclosure is configured to mechanically hold a charge or ingot of conductive metal foam in a mold cavity of a mold tool in such a way that edges of the conductive metal foam are cordoned off. That is, the charge can be placed in a mold cavity formed in a core tool.

Hydraulic force of a press apparatus is used to create a seal around an outside perimeter of the charge. Filler or overmolding material is flowed into the mold apparatus, which bonds to the conductive metal foam. Excess conductive metal foam (embedded with the overmolding material and/or filler) can be trimmed off around the outside of the overmolded part after the overmolding operation.

In some embodiments, the conductive metal foam is mechanically held in place within a mold cavity using pinch pins to ensure the conductive metal foam is forced to the inside or outside of the mold cavity. The conductive metal foam is pinched in these pinch pins so that it stays in position inside the mold cavity during the molding operation. The conductive metal foam can be encased in the overmolding material.

In various embodiments, a mold apparatus having a mold cavity can also include shut off windows that create areas free from any molded material on either side of the foam or on both sides of the foam simultaneously. These windows could be used for adding heat sinks to either side of the conductive metal foam after the molding operation.

In one or more embodiments the conductive metal foam is pre-formed so as to allow expansion or contraction before it is placed inside a mold cavity. With some expansion left, pressure from the molding process further compresses the foam securing into the mold cavity.

In various embodiments, slides disposed inside a mold cavity could pre-form areas of conductive metal foam near overmolding gates so these areas could fill first forcing the material to one side or the other.

In various embodiments, a hot runner system is employed for a die cast product to fill from a backside of the mold cavity forcing the conductive foam to either the core or the cavity side.

In one or more embodiments, example mold apparatuses comprises gates proximate a middle of the mold cavity that could separate and force two layers of conductive foam simultaneously, one layer would be forced to the outer cavity side of the mold and another conductive layer would be forced to the core side of the mold cavity and the die cast material would be a layer in between the two conductive foam layers.

One advantage of using conductive metal foam inside a mold cavity is that the conductive metal foam can expand and contract, allowing for overall parts that are flatter after the molding operation.

In various embodiments, the conductive metal foam is overmolded with an overmolding material that bonds or encases the conductive metal foam within a product. In some embodiments, the overmolding creates a die-cast product.

In some embodiments, the conductive metal foam can be plated (for example with Nickel) before over molding to protect the conductive metal foam from corrosion.

In one or more embodiments, the present disclosure allows for inserting of conductive metal foams into plastic injecting process so as to produce parts that can then be sealed together using ultrasonic welding. That is, the conductive metal foam can be overmolded with a plastic or polymeric material.

These and other advantages of the present technology will be described with reference to the collective drawings.

FIG. 1 is a top-down view of an example apparatus 100 constructed in accordance with the present disclosure. In general, the apparatus 100 is a hydraulic press or compression mold apparatus comprising a first portion 102 (also referred to as a lower portion) and a second portion 104 (also referred to as an upper portion or second tool). When compressing, the first portion 102 can translate relative to the second portion 104 or vice versa. In some embodiments, parts (or all) of both the first portion 102 and the second portion 104 translate when performing a compressing action.

In some embodiments, a core tool 106 (also referred to as a first tool) is located on the lower portion 102 of the compression mold apparatus. The core tool 106 comprises an outer encasement 108 that encloses a terminal end of a piston 110 of the first portion 102. This encasement generally defines a mold cavity that receives the conductive foam.

Figure 2:
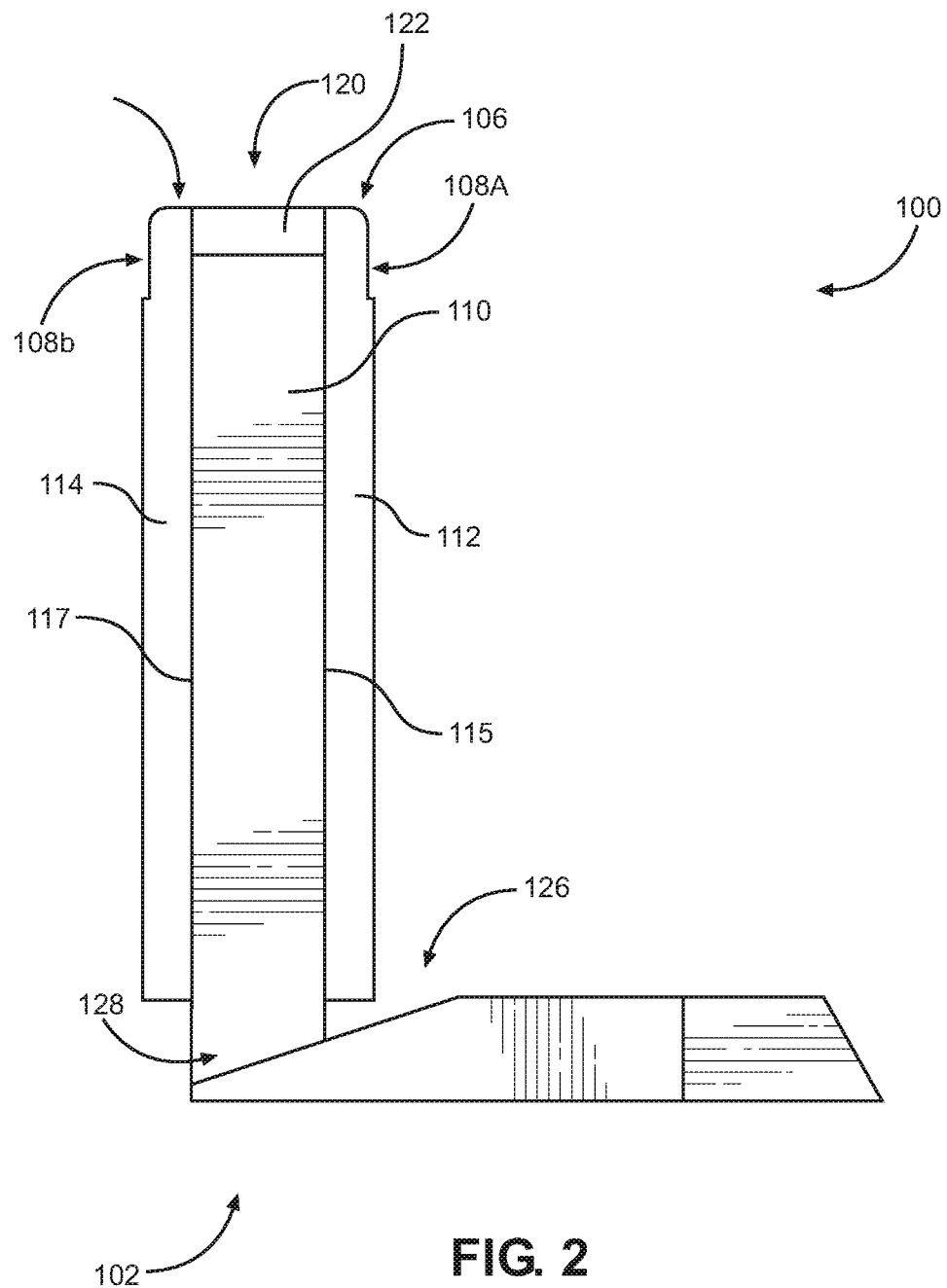
FIG. 2 is a side cross-sectional view of the apparatus of FIG. 1.

The core tool can have any desired shape, but as illustrated in FIG. 2, core tool 106 can comprise a first vertical sidewall 112 and a second vertical sidewall 114. These sidewalls enclose a front surface 115 and a back surface 117 of the piston 110. It will be understood that the view of FIG. 2 is a cross sectional view. Additional vertical sidewalls that enclose the left surface and right surface of the piston 110 are not illustrated in this view, but are generally illustrated in FIG. 1. Notwithstanding, the first vertical sidewall 112, the second vertical sidewall 114, a third sidewall 116, and a forth sidewall 118 of the core tool 106 cooperate to form a mold cavity 120 as best illustrated in FIG. 1. This mold cavity 120 receives a charge 122 made of conductive metal foam therein. In this embodiment, the conductive metal foam is an ingot having a size and shape that approximately corresponds to the size and shape of the mold cavity 120.

In some embodiments, a terminal end of the outer encasement 108 of the core tool 106 is shaped to accept a portion of the overmolding material. For example, the outer encasement 108 includes indentations 108A and 108B that fill with overmolding material when the overmolding material flows into the apparatus 100 as will be discussed in greater detail infra.

The entirety of the core tool 106 is illustrated in FIG. 1, which is a male tooling surface 111 that creates a resulting die-cast part. The outer encasement 108 is part of the male tooling surface 111. A corresponding female tooling surface 113 is found on the lower surface of the second portion 104 (see FIG. 3).

To be sure, as illustrated in FIG. 2, the first portion 102 also comprises a means for translating the lower portion of the compression mold apparatus into the upper portion of the compression mold apparatus so as to compress the uncompressed charge of conductive metal foam into a compressed charge of conductive metal foam. In some embodiments, this means comprises a cam 124 disposed in perpendicular relationship to the piston 110 of the core tool 106. In general, the piston is a cam activated piston. The cam 124 comprises a cam wedge 126 that cooperates with a core tool wedge 128 of the piston 110 to drive the piston 110 of the core tool 106 upwardly through the outer encasement 108.

In some embodiments, the translation of the piston 110 occurs subsequently to, or in conjunction with the downward translation of the second portion 104 of the apparatus 100.

Figure 3:
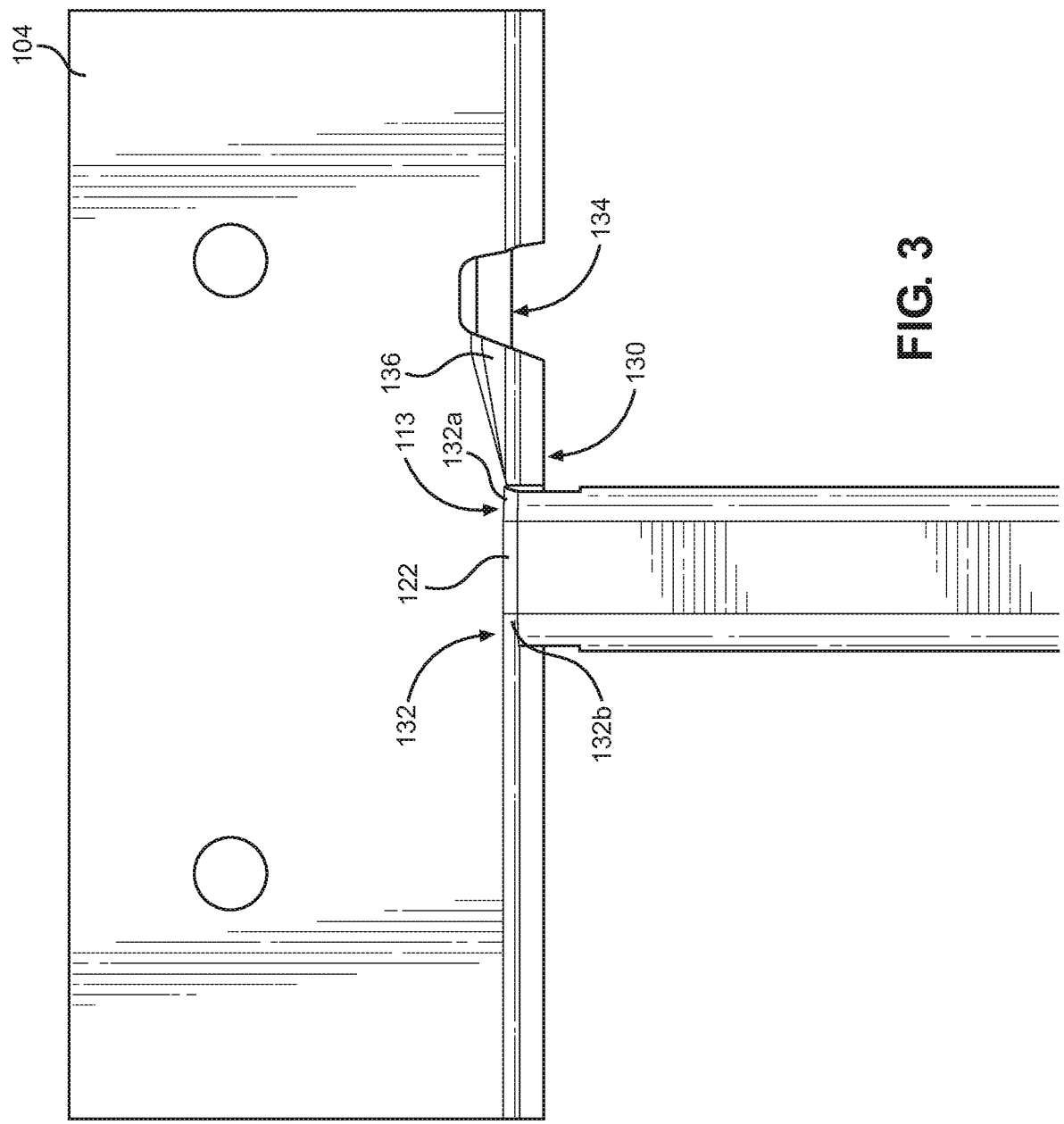
FIG. 3 is a side cross-sectional view of the apparatus of FIG. 1 where the lower and upper portions of the apparatus compress a charge.

According to some embodiments, as in FIG. 3, the second portion 104 of the apparatus 100 comprises an upper mold cavity 130 that is configured to lower onto the charge 122. The upper mold cavity 130 is shaped to ensure that a space or gap 132 exists between an inner surface of the upper mold cavity 130 and an outer surface of the outer encasement 108. This space or gap 132 receives the overmolding material.

In some embodiments, the upper mold cavity 130 contacts an upper surface of the charge 122 while a lower surface of the charge 122 contacts an upper surface of the piston 110.

Figure 4:
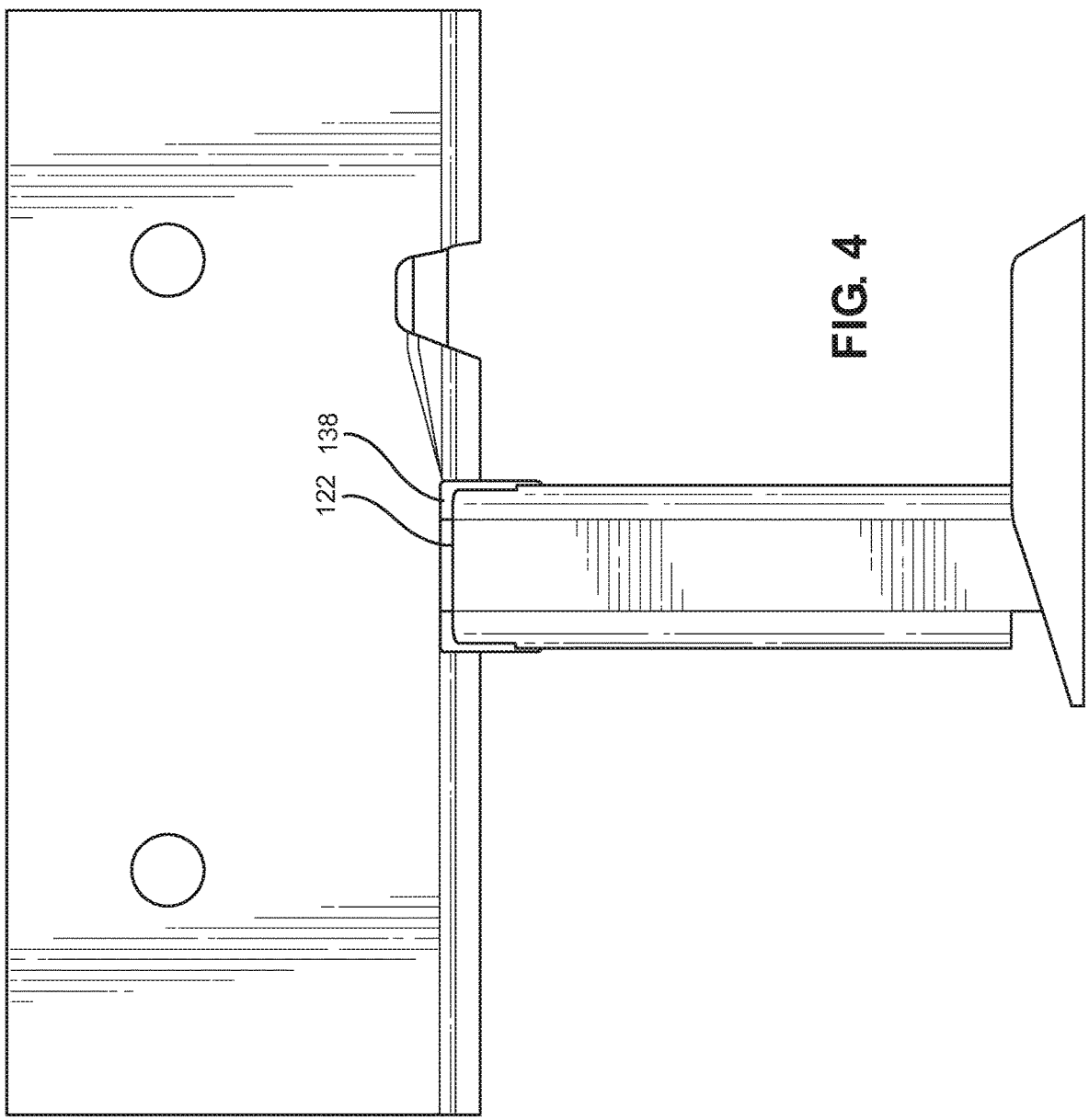
FIG. 4 illustrates the overmolding of the charge.

In operation, the cam 124 is translated horizontally, for example, by a hydraulic press (not shown). Latitudinal movement of the cam 124 forces the cam wedge 126 to slide in relation to the core tool wedge 128. The relative angles between the cam wedge 126 and the core tool wedge 128 cause the piston 110 to be driven upwardly when the cam 124 is moved latitudinally. That is, as the cam 124 is moved latitudinally, the core tool wedge 128 of the piston 110 translates upwardly along the angled surface of the cam wedge 126. This relative translation is illustrated in FIGS. 2 and 4 collectively.

This vertical translation of the piston 110 compresses the charge 122. That is, the uncompressed charge of conductive metal foam is transformed to a compressed charge of conductive metal foam. The relative degree of compression creates a resultant product with different material properties. For example, in some embodiments the compressed charge of conductive metal foam is only partially compressed during the translation of the apparatus 100 so as to create a partially compressed charge of conductive metal foam that retains pathways providing a capillary effect to draw in an overmolding material. In other embodiments, the compressed charge of conductive metal foam is completely compressed during the translation of the apparatus 100 so as to create a fully compressed charge of conductive metal foam where all fluids, such as air, have been expelled. Thus, the thickness of the resultant compressed charge of conductive metal foam can be selectively chosen. The force required to compress the charge of conductive metal foam is based on the material properties of the conductive metal foam, such as porosity and modulus of the metal or alloy used to create the conductive metal foam. Non-limiting examples of metals or alloys that can be used include copper, graphene, graphane, or other similar materials or combinations of materials that would be known to one of ordinary skill in the art with the present disclosure before them. Example methods for creating conductive metal foams can be found in co-pending applications: U.S. application Ser. No. 14/876,733, filed on Oct. 6, 2015; U.S. application Ser. No. 14/947,951 filed on Nov. 20, 2015; and U.S. application Ser. No. 15/017,578, filed on Feb. 5, 2016.

Once the charge of conductive metal foam has been compressed to the desired thickness, an overmolding material can be injected through a port 134 in the second portion 104 as illustrated in FIG. 3. Any desirable overmolding material can be utilized such as a liquid metal and/or alloy, as well as other fluid products such as a plastic or polymer. To be sure, any fluid material can be utilized as an overmolding material. The overmolding material is directed through channel 136 into the space or gap 132. In this embodiment, the charge 122 is still compressed, so the space or gap 132 is divided into two sections 132A and 132B, with the charge 122 bridging therebetween. When the charge 122 is uncompressed or only partially compressed, the overmolding material will flow into section 132B from section 132A, through the porous structure of the charge 122.

The overmolding material can also fill the vertical spaces defined by the indentations 108A and 108B. This creates a die-cast product which includes the charge 122 integrated therein.

Figure 5:
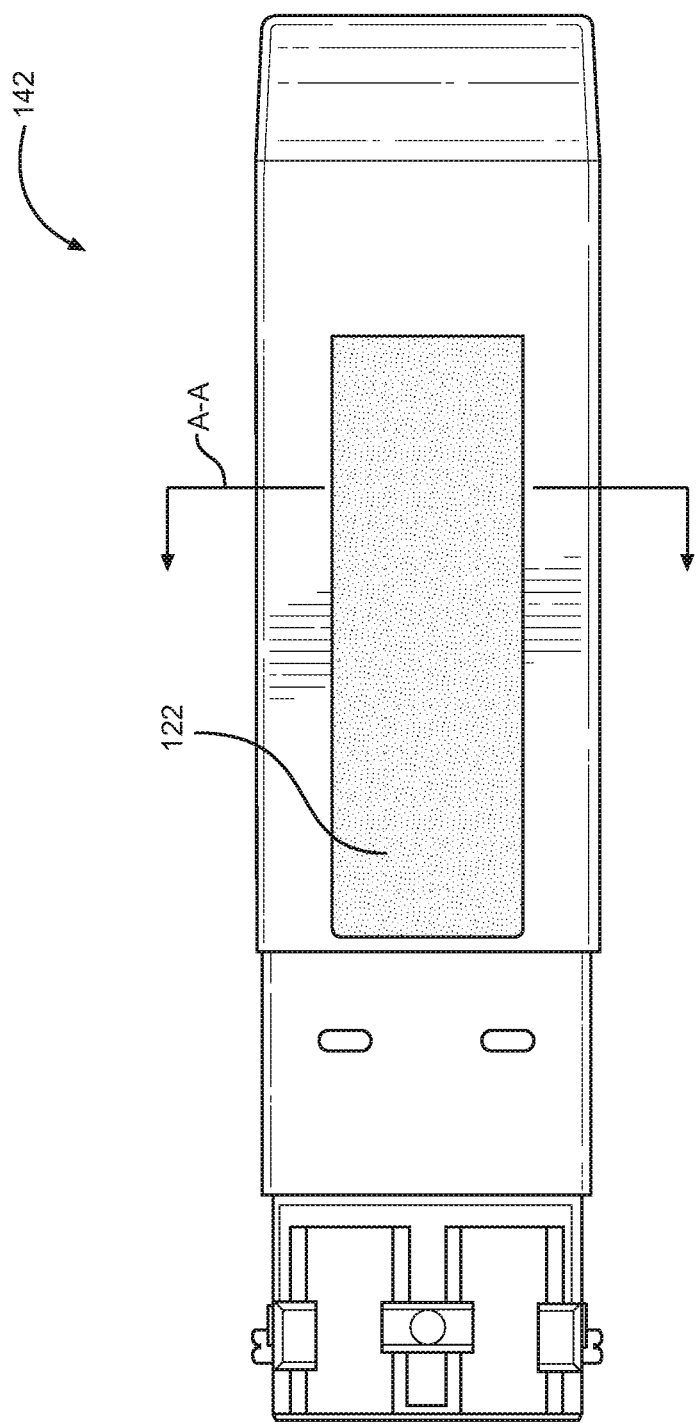
FIG. 5 is a top-down view of an example overmolded product with the compressed charge integrated.
Figure 6:
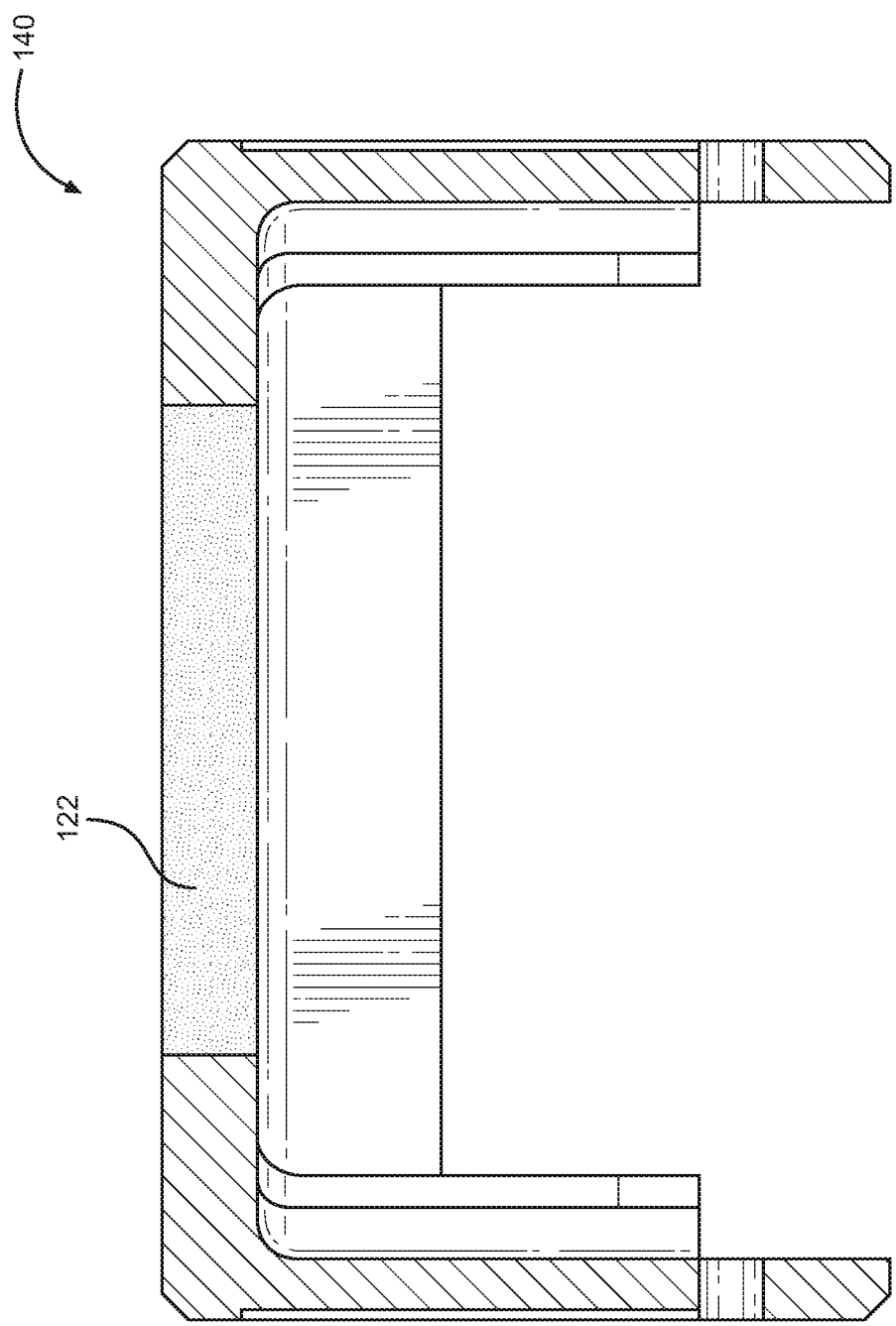
FIG. 6 is a cross sectional view of the example overmolded product taken about line A-A of FIG. 5.

The overmolding material 138 of the die-cast product is illustrated in FIG. 4. The complete die-cast product 140 with integrated charge 122 is also illustrated in FIG. 5 removed from the apparatus 100. In this example, the die-cast body is created from zinc flowed over the charge 122, which comprises a copper conductive foam. FIG. 6 is a cross-sectional view of the product 140 of FIG. 5, taken through line A-A showing the integrated charge 122.

While a specifically shaped product 140 is illustrated, the disclosure provided above can be utilized to create die-cast and overmolded products of any shape and/or size.

FIGS. 7-10 collectively illustrate another example molding apparatus 200 that utilizes pinch pins. Rather than compressing a charge of conductive metal foam, a conductive metal foam ingot 202 (either uncompressed or compressed) can be disposed in a mold cavity 204 of a core tool 206 (with male tooling surface). The mold cavity 204 is defined by an aperture 207 formed in the core tool 206.

Figure 7:
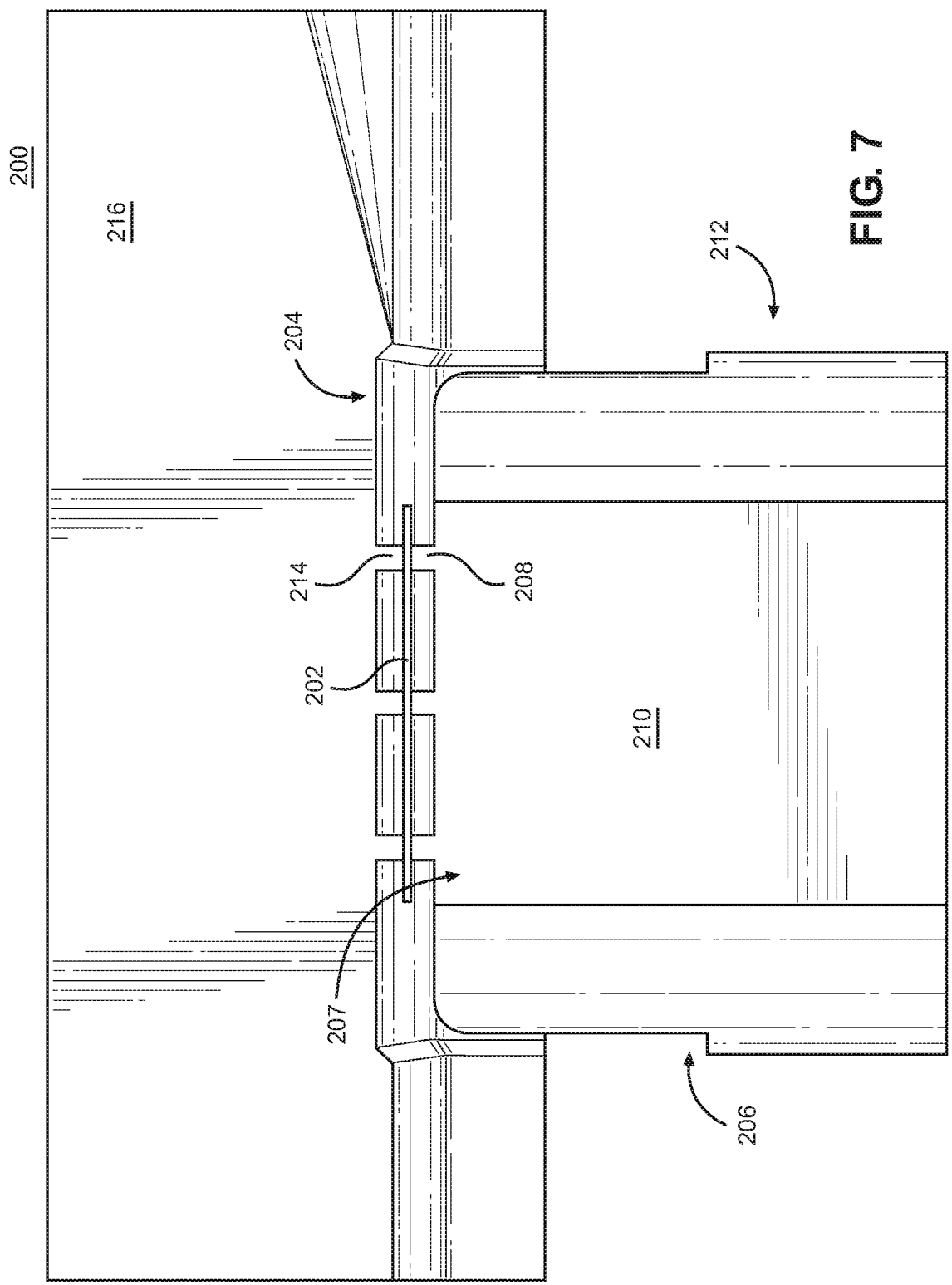
FIG. 7 is a side cross-sectional view another example apparatus that utilizes pinch pins to secure a charge or ingot.

This core tool 206 can be disposed on a piston 210, which is similar to the piston 110 of apparatus 100 described above. Indeed, the translating portions of the apparatus 100 can be utilized with the apparatus 200 of FIGS. 7-10 such as the cam and piston. The aperture 207 that defines the mold cavity is similar to that illustrated in FIGS. 1-9, whereas FIG. 7 illustrates the piston 210 having been translated upwardly in the aperture of the core tool 206, so the aperture is not visible.

Figure 8:
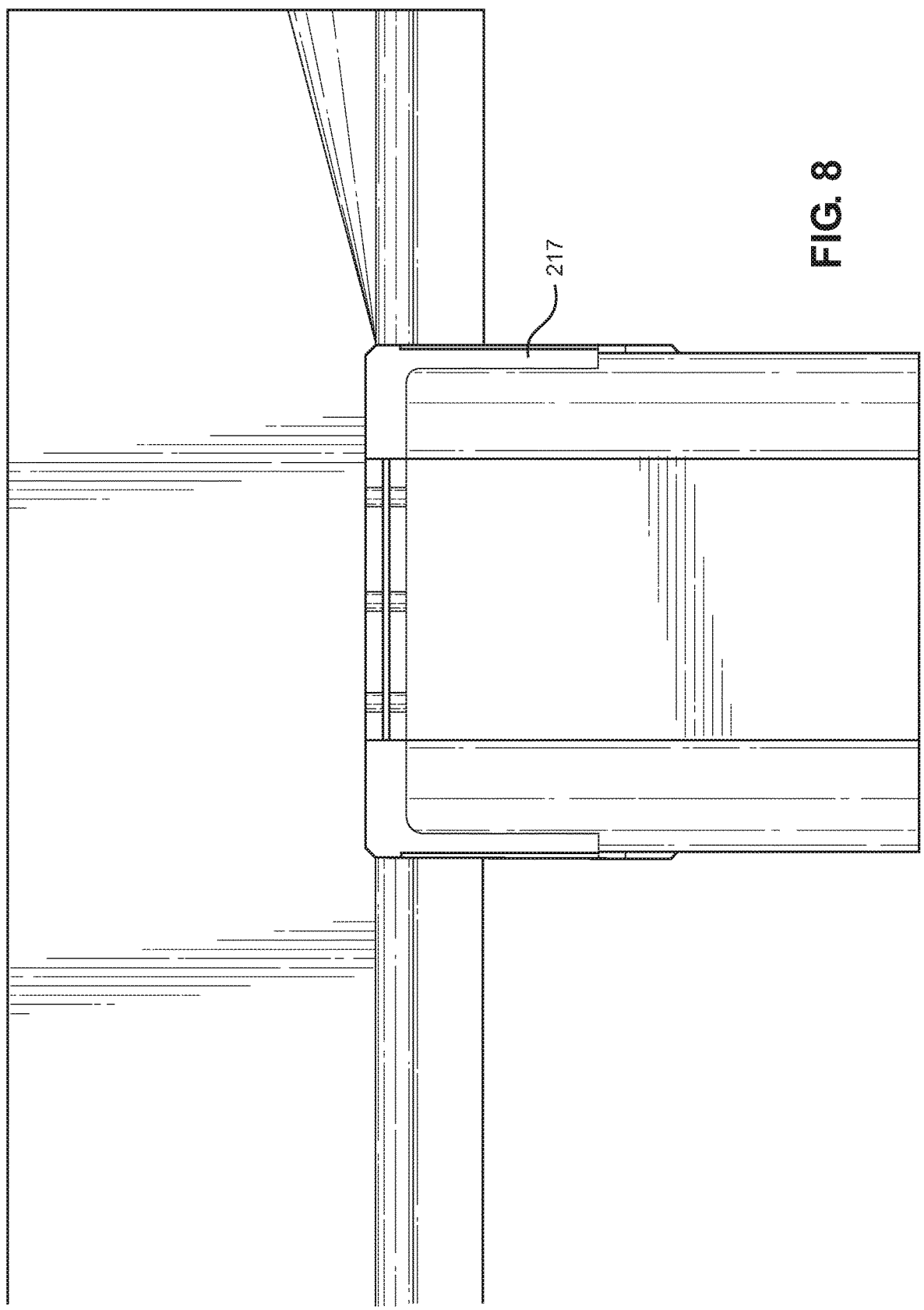
FIG. 8 is a side cross-sectional view of overmolding of the charge or ingot inside the apparatus.

The ingot 202 is secured between a set of pinch pins, such as pinch pin 208, which are disposed on a terminal end of the piston 210 of a first portion 212 of the apparatus 200. A set of pinch pins that distend from an upper tool, such as pinch pin 214 of a second portion 216 of the apparatus 200. The ingot 202 remains securely held between the pinch pins during overmolding with an overmolding material 217 as illustrated in FIG. 8.

In one or more embodiments, the plurality of pinch pins on the first or upper portion of the apparatus 200 align with the plurality of pinch pins on the first or lower portion of the apparatus 200, such as the piston 210.

Figure 9:
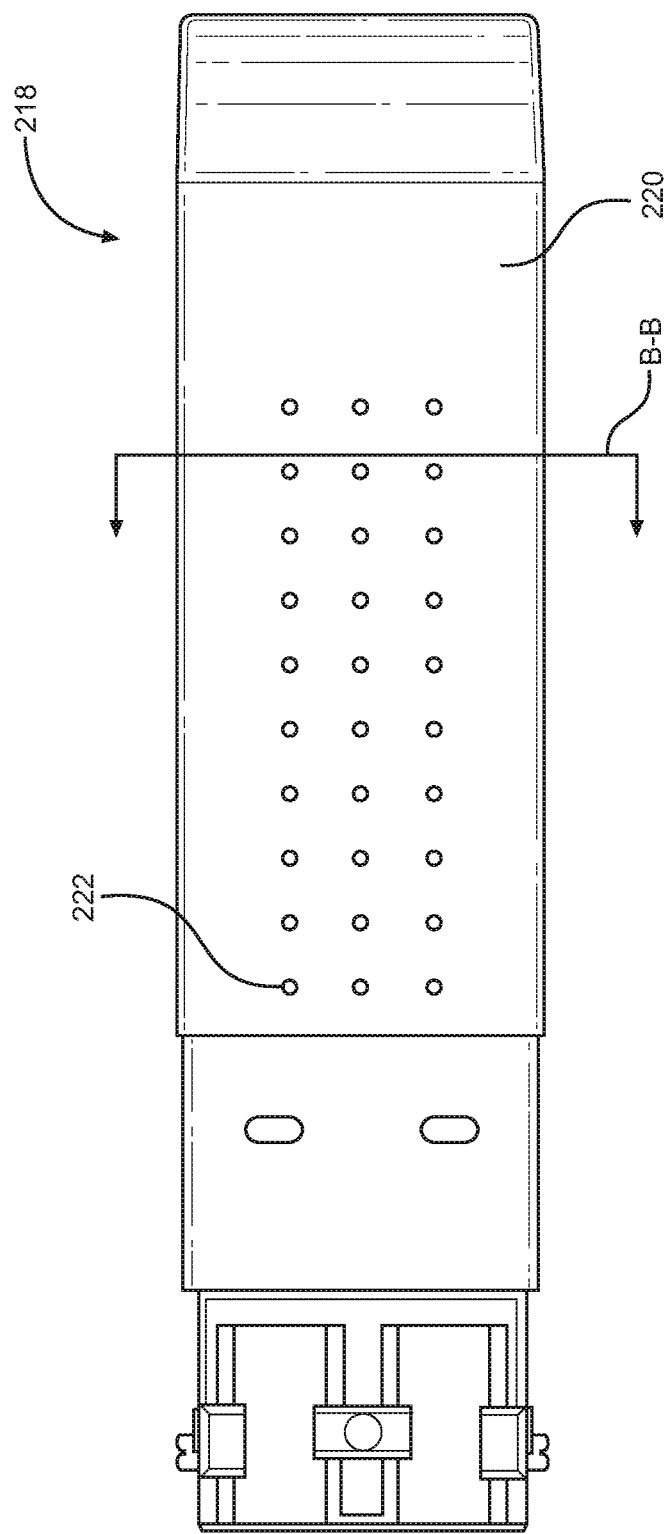
FIG. 9 is a top-down view of an example overmolded product with the charge integrated.

A resultant overmolded product 218 is illustrated in FIG. 9. The outer surface 220 of the overmolded product 218 comprises apertures such as aperture 222 created when the overmolded product 218 is removed from the apparatus 200 and the pinch pins are retracted. These apertures can create a pathway for electrical conductivity. For example, a coating or electrical component with corresponding protrusions can be placed onto the outer surface 220 of the overmolded product 218 and flowed, roll-bonded, or compressed into the apertures. In one example, the electrical component could include a conductive electrical pad.

Figure 10:
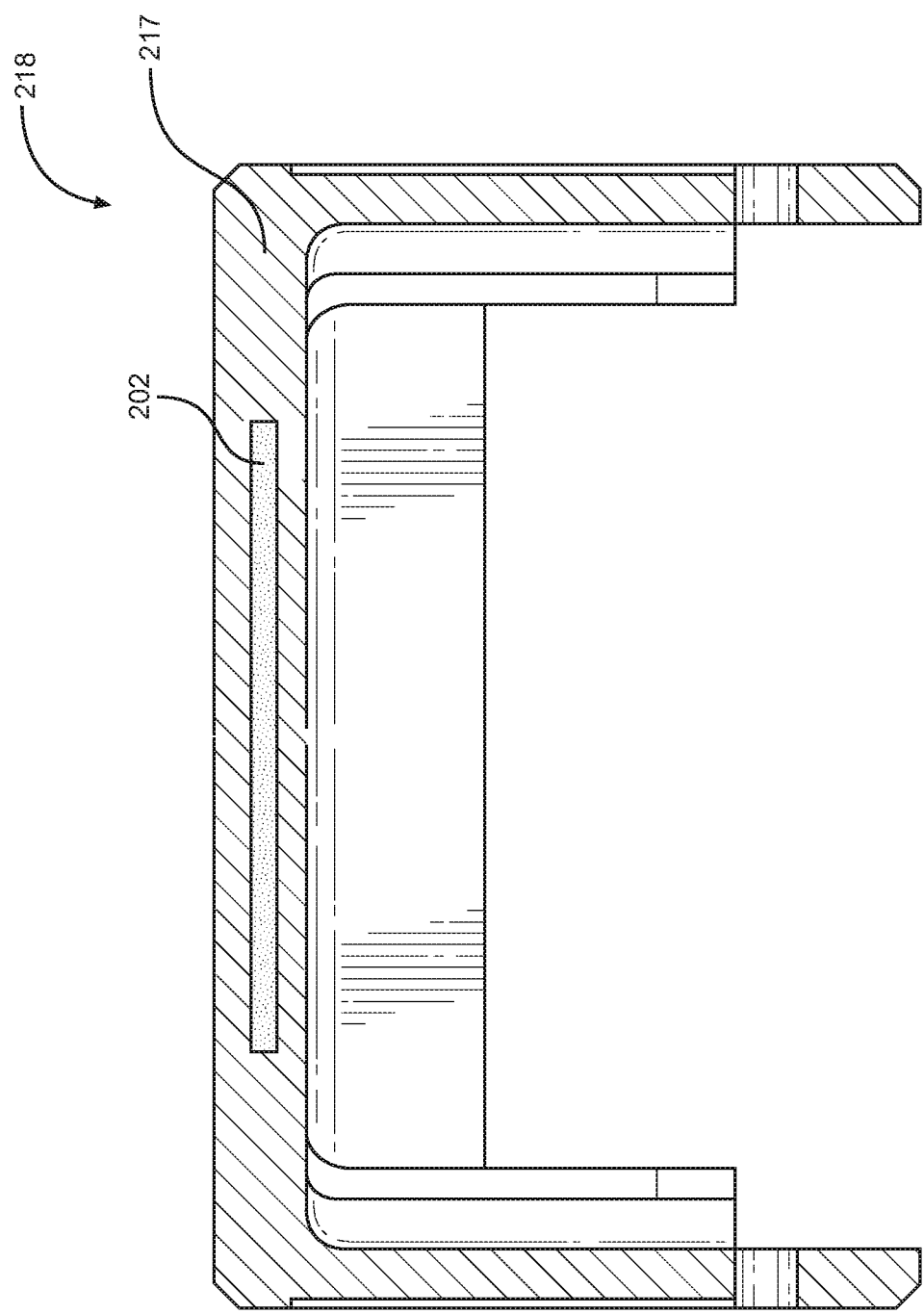
FIG. 10 is a cross sectional view of the example overmolded product taken about line B-B of FIG. 9.

FIG. 10 is a cross-section of the overmolded product 218 taken along line B-B of FIG. 9. The ingot 202 is suspended between areas of overmolding material 217 above and below the ingot 202.

Figure 11:
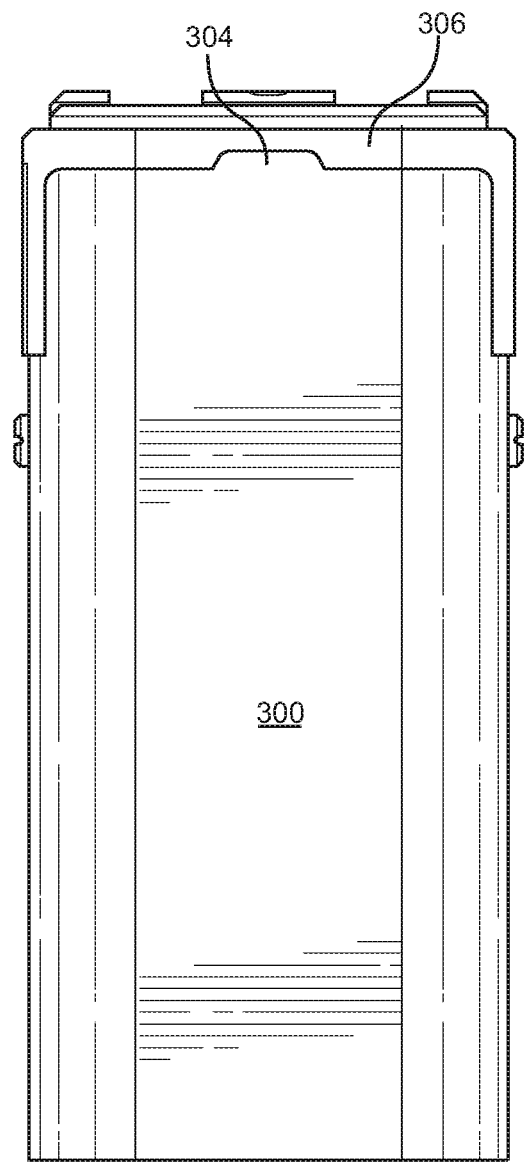
FIG. 11 is a cross sectional view of a piston of another example apparatus, the piston having one or more features.
Figure 12:
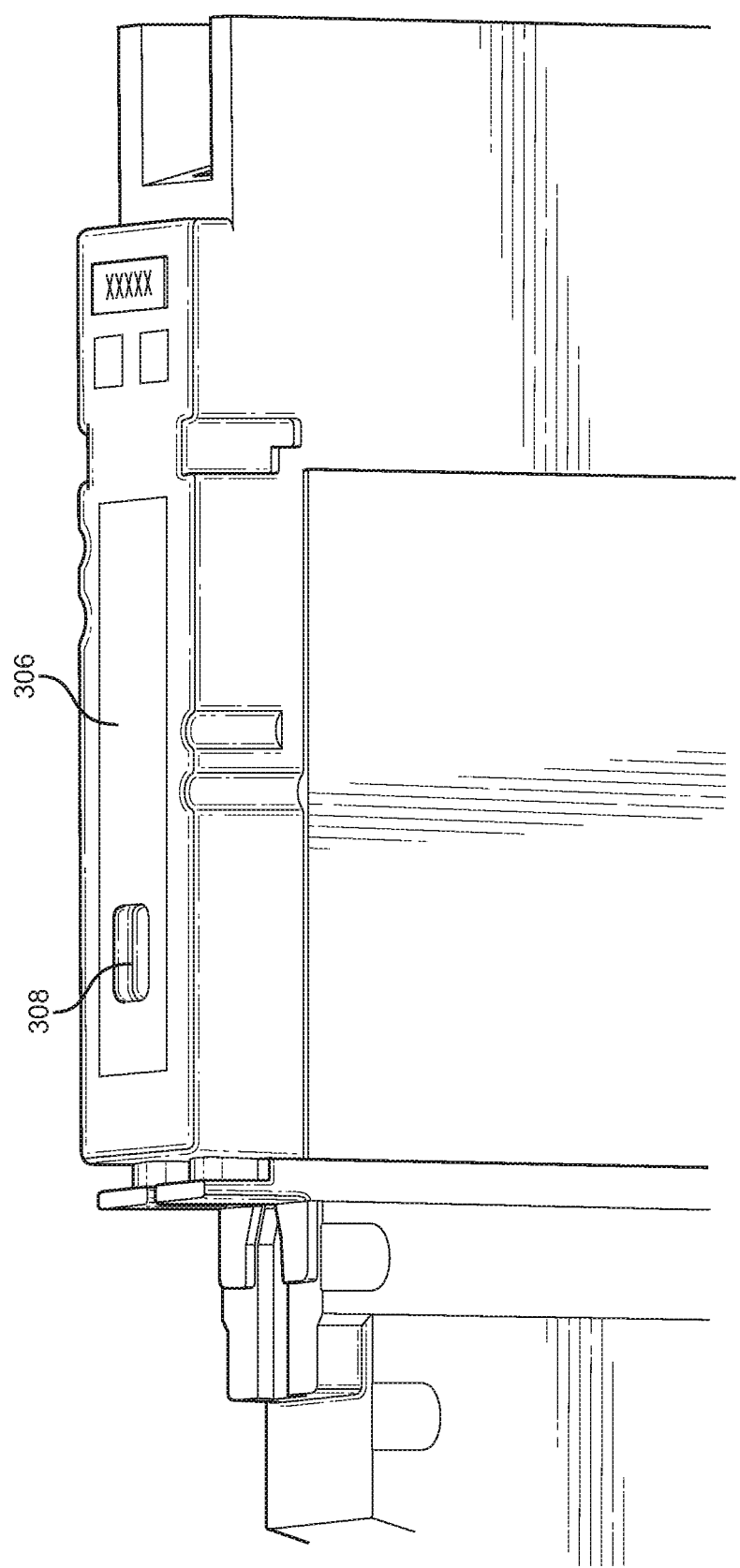
FIG. 12 is a perspective view of an example overmolded product with a charge that comprises a feature that was transferred by the piston of FIG. 11.

FIGS. 11 and 12 collectively illustrate another example embodiment of a piston 300 that can be used to create a compressed conductive metal foam object with one or more features. In this embodiment, the piston 300 comprises a feature 304, such as a protrusion. When the piston 300 compresses a charge of conductive metal foam 306 against an upper tooling member (see various second portions of apparatuses disclosed above), the feature 304 is transferred to the charge 306. As in FIG. 12, the charge 306 comprises the transferred feature 308.

This creates areas of differing density in the resultant compressed conductive metal foam. That is, areas that are more compressed due to the presence of a feature in the piston have a density that is greater than surrounding areas which are not compressed as greatly. This allows part of the resulting conductive metal foam to be compressed completely, while other parts are not compressed at all or are only partially compressed.

Figure 13:
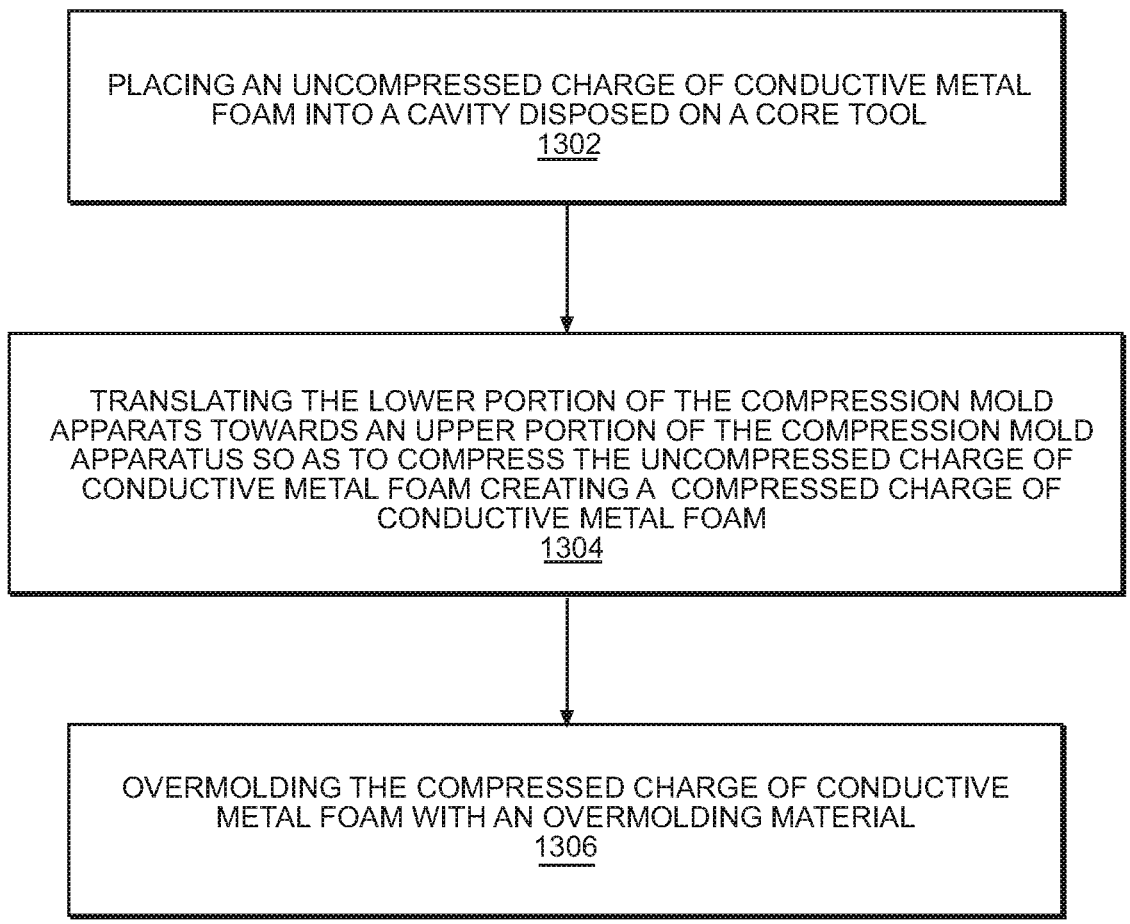
FIG. 13 is a flowchart of a method for compressing a conductive metal foam charge and overmolding the same with an overmolding material.

FIG. 13 illustrates an example flowchart of a method of the present disclosure. In some embodiments, the method comprises a step 1302 of placing an uncompressed charge of conductive metal foam into a cavity disposed on a core tool. To be sure, the core tool is located on a lower portion of a compression mold apparatus, such as a piston which is driven by a cam. The conductive metal foam can be created from any suitable material.

Next, the method includes a step 1304 of translating the lower portion of the compression mold apparatus towards an upper portion of the compression mold apparatus so as to compress the uncompressed charge of conductive metal foam creating a compressed charge of conductive metal foam.

In various embodiments, a space is maintained between the lower and upper portions of the compression mold apparatus. In some embodiments, the method comprises a step 1306 of overmolding around and through the compressed charge of conductive metal foam with an overmolding material. This can include injecting the overmolding material into the space between the upper and lower portions of the apparatus. To be sure, the lower and upper portions of the apparatus provide male and female tooling surfaces that define the outer peripheral shape/geometry of the overmolded product (e.g., die-cast product). The compressed charge of conductive metal foam forms a portion of the outer surface of the overmolded product in some embodiments.

Figure 14:
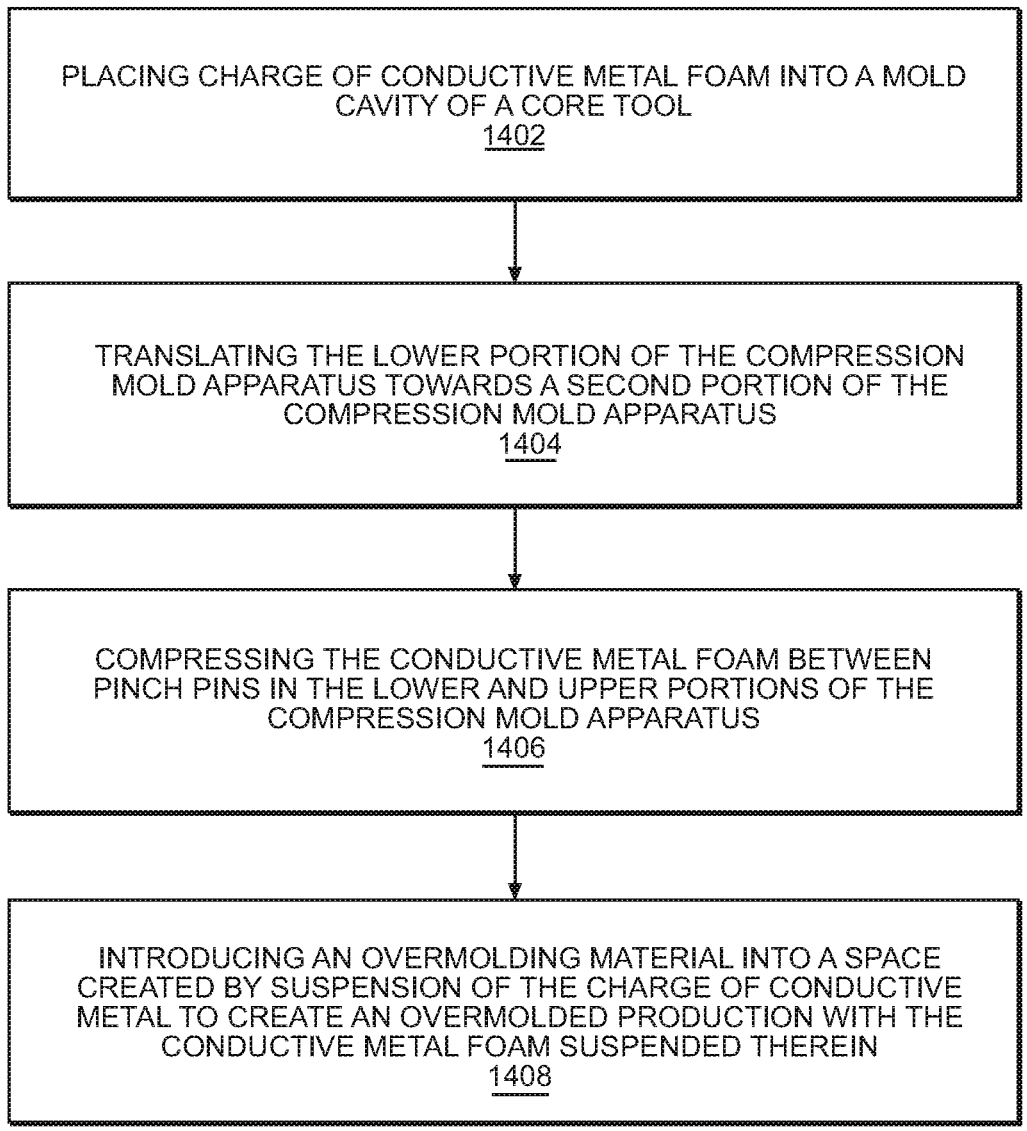
FIG. 14 is a flowchart of a method for securing a conductive metal foam charge or ingot using pinch pins, and overmolding the same with an overmolding material.

FIG. 14 is another example method of the present disclosure. The method comprises a step 1402 of placing charge of conductive metal foam into a mold cavity of a core tool. As mentioned above, the core tool is located on a first portion of a compression mold apparatus. Also, a mold cavity is defined by a lower surface of a piston that comprises a plurality of pinch pins in some embodiments. The pinch pins extend from a piston of the first portion. Sidewalls that outline an aperture in the core tool further define the mold cavity.

Next, the method comprises a step 1404 of translating the lower portion of the compression mold apparatus towards a second or upper portion of the compression mold apparatus. To be sure, the second portion of the apparatus comprises a second plurality of pinch pins that align with the plurality of pinch pins of the piston. It will be understood that the second plurality of pinch pins and the plurality of pinch pins of the piston suspend the charge of conductive metal. Thus, the method includes a step 1406 compressing the conductive metal foam between pinch pins in the lower and upper portions of the compression mold apparatus.

Next, the method includes a step 1408 of introducing an overmolding material into a space created by suspension of the charge of conductive metal. To be sure, the overmolding material saturates the charge of conductive metal foam in some instances.

In one or more embodiments, the method can include pulling or inducing a vacuum within the overmolding apparatus during the overmolding process.

Figure 15:
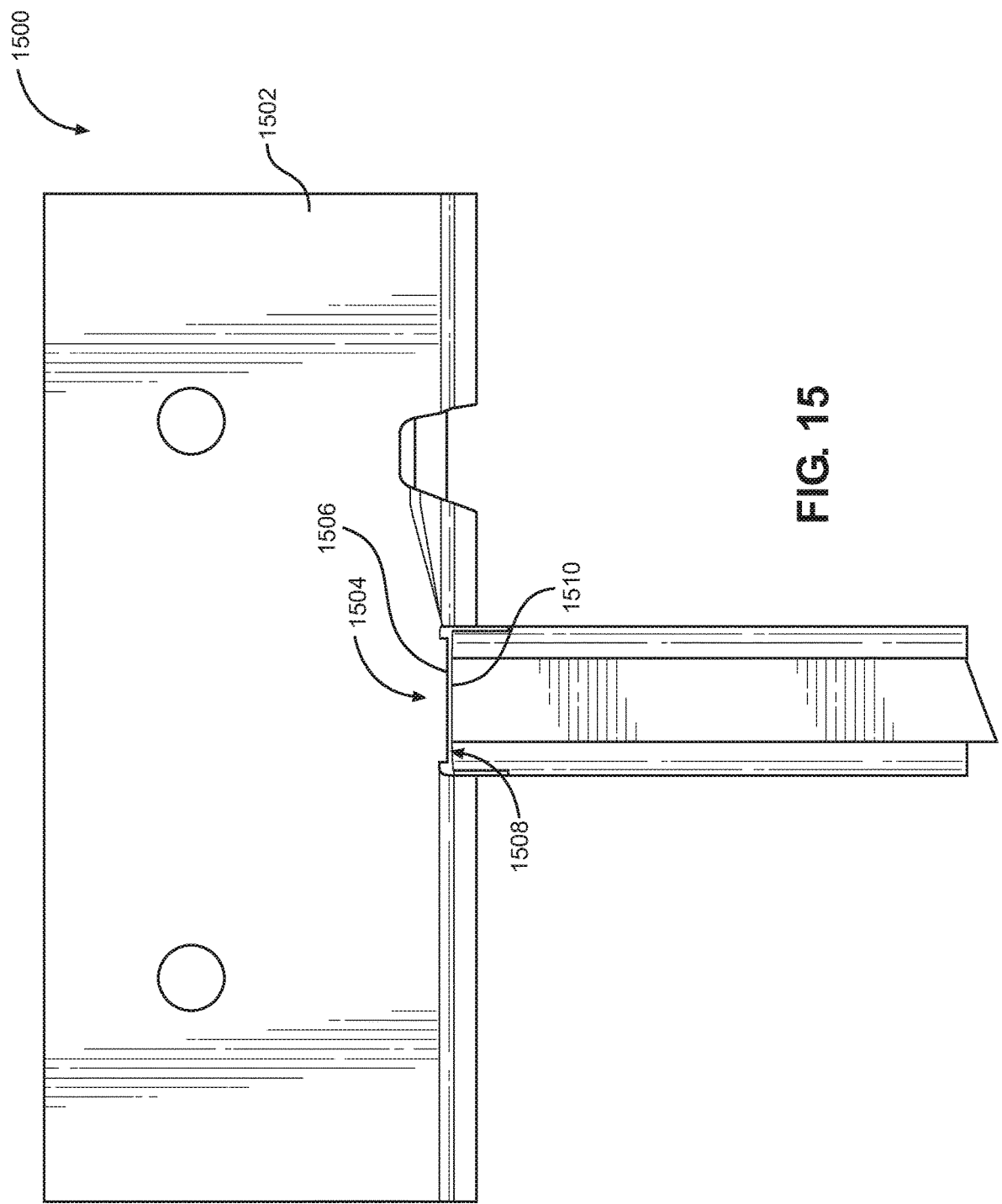
FIGS. 15-17 collectively illustrate another example apparatus having gates that are utilized to create an overmolded product that can receive or interface with another product, such as a heat sink.
Figure 16:
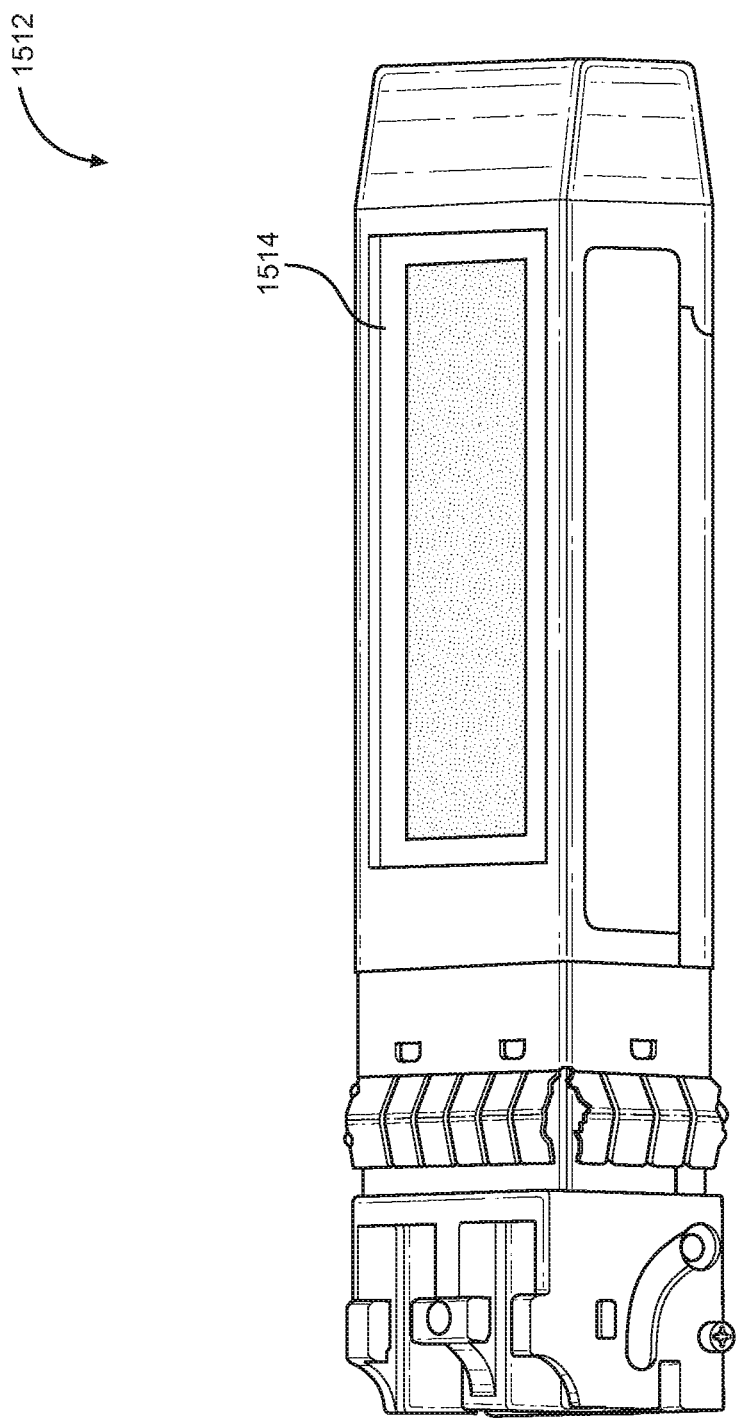
Figure 17:
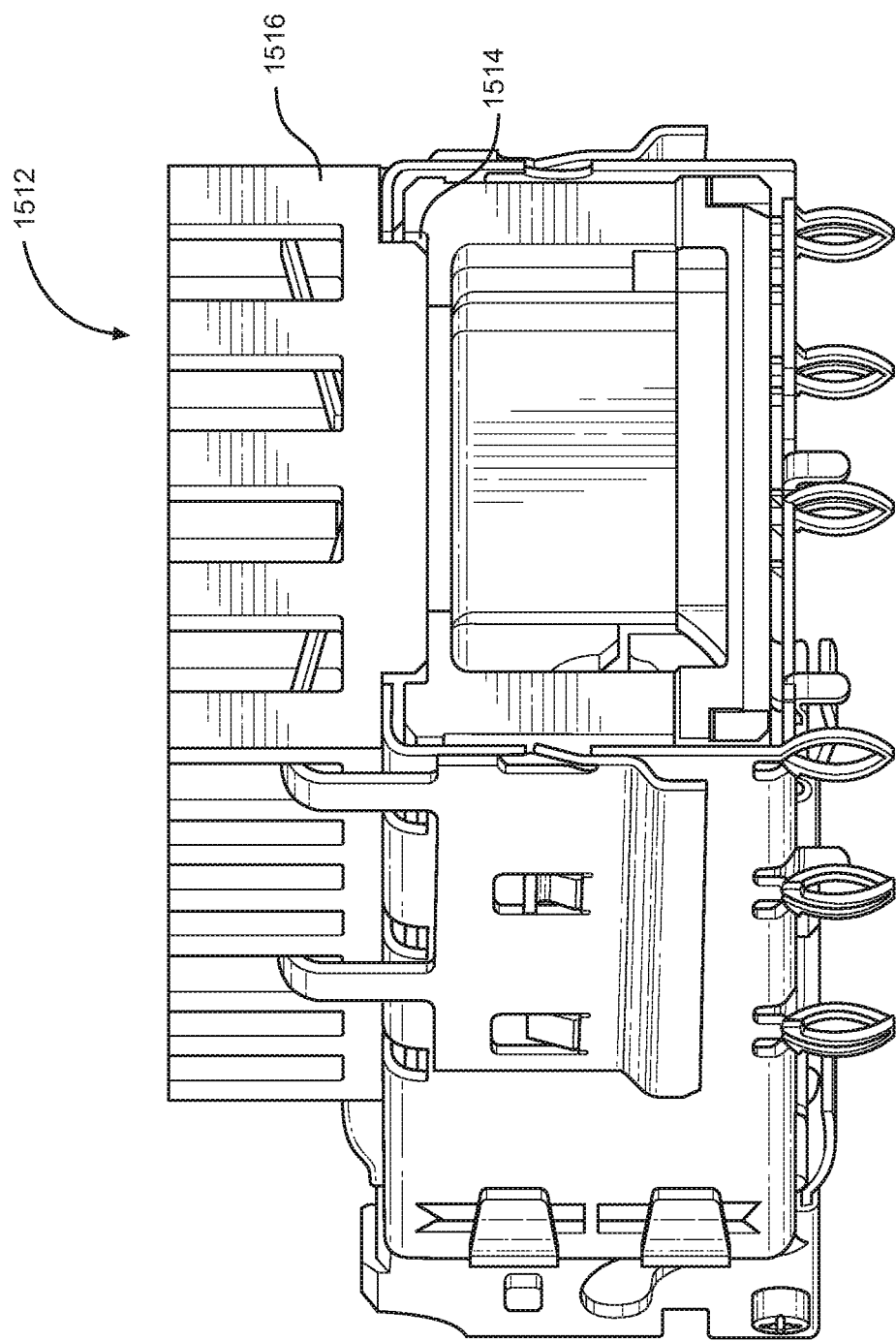

FIG. 15 is another example overmolding apparatus 1500 that comprises shutoff windows. In some embodiments, the apparatus 1500 comprises an upper mold portion 1502 that comprises a shutoff window 1504 that is formed by creating a notched down area 1506 that extends into a cavity or space 1508 where an ingot 1510 is compressed. The space 1508 is somewhat obscured due to the apparatus 1500 and ingot 1510 being in a compressed state. FIG. 16 illustrates a resultant overmolded product 1512 having an indentation 1514 created by the notched down area in the upper mold cavity of the apparatus. FIG. 17 illustrates the product 1512 with a heat sink 1516 inserted into the indentation 1514. A conductive metal foam 1518 is illustrated.

Figure 18:
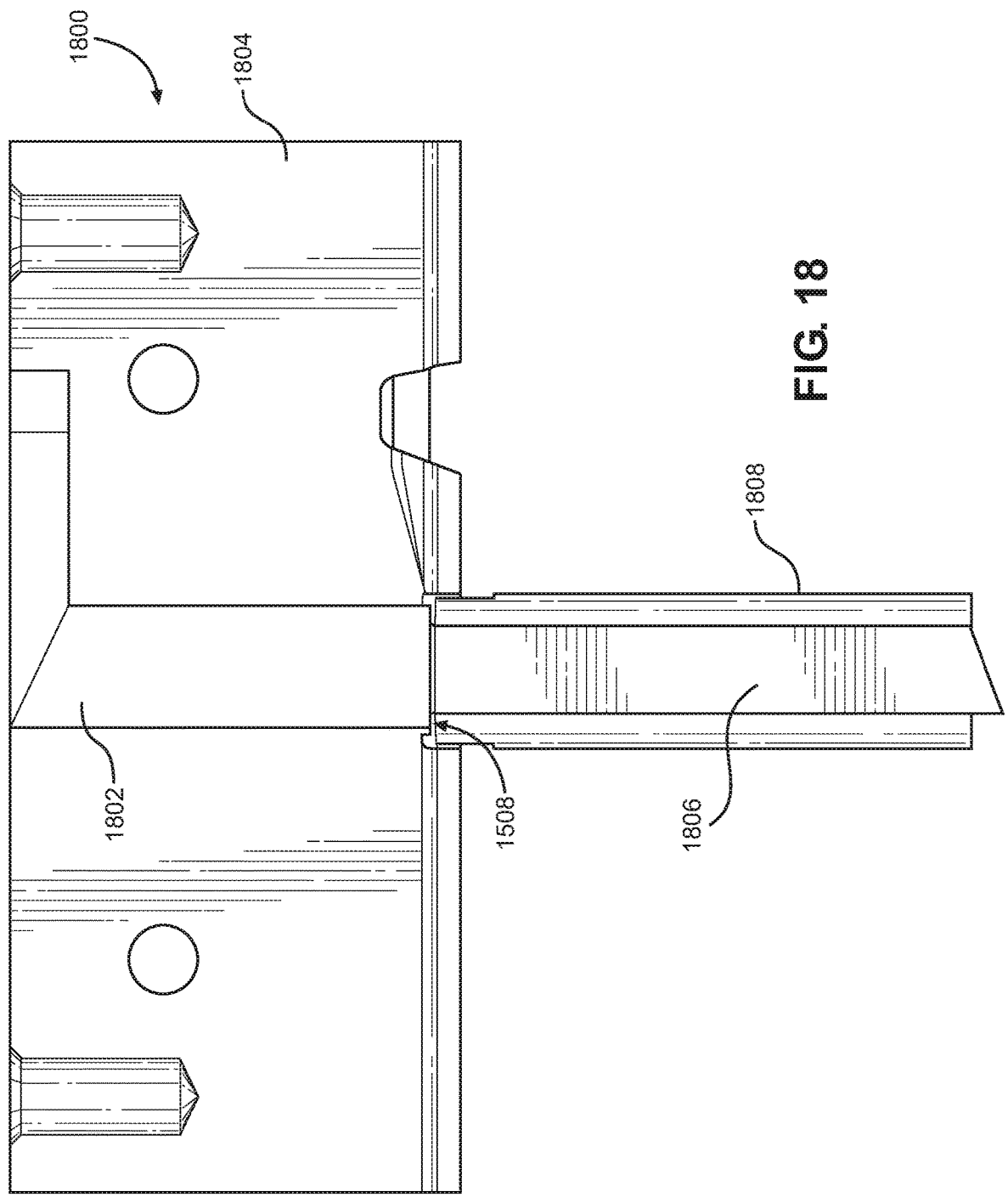
FIG. 18 illustrates another example dual-piston apparatus constructed in accordance with the present disclosure.

FIG. 18 illustrates another example compression mold apparatus 1800. This apparatus comprises both an upper piston 1802 associated with an upper mold portion 1804 and a lower piston 1806 associated with a lower mold portion 1808. Both the upper and lower pistons 1802 and 1806 are driven by a cam as disclosed in the embodiments above with reference to FIG. 2. Thus, both upper and lower pistons 1802 and 1806 cooperate to compress an ingot therebetween.

In this embodiment, one of the upper or lower pistons could be replaced with a fixed form member when the piston is held in fixed position.

Figure 19:
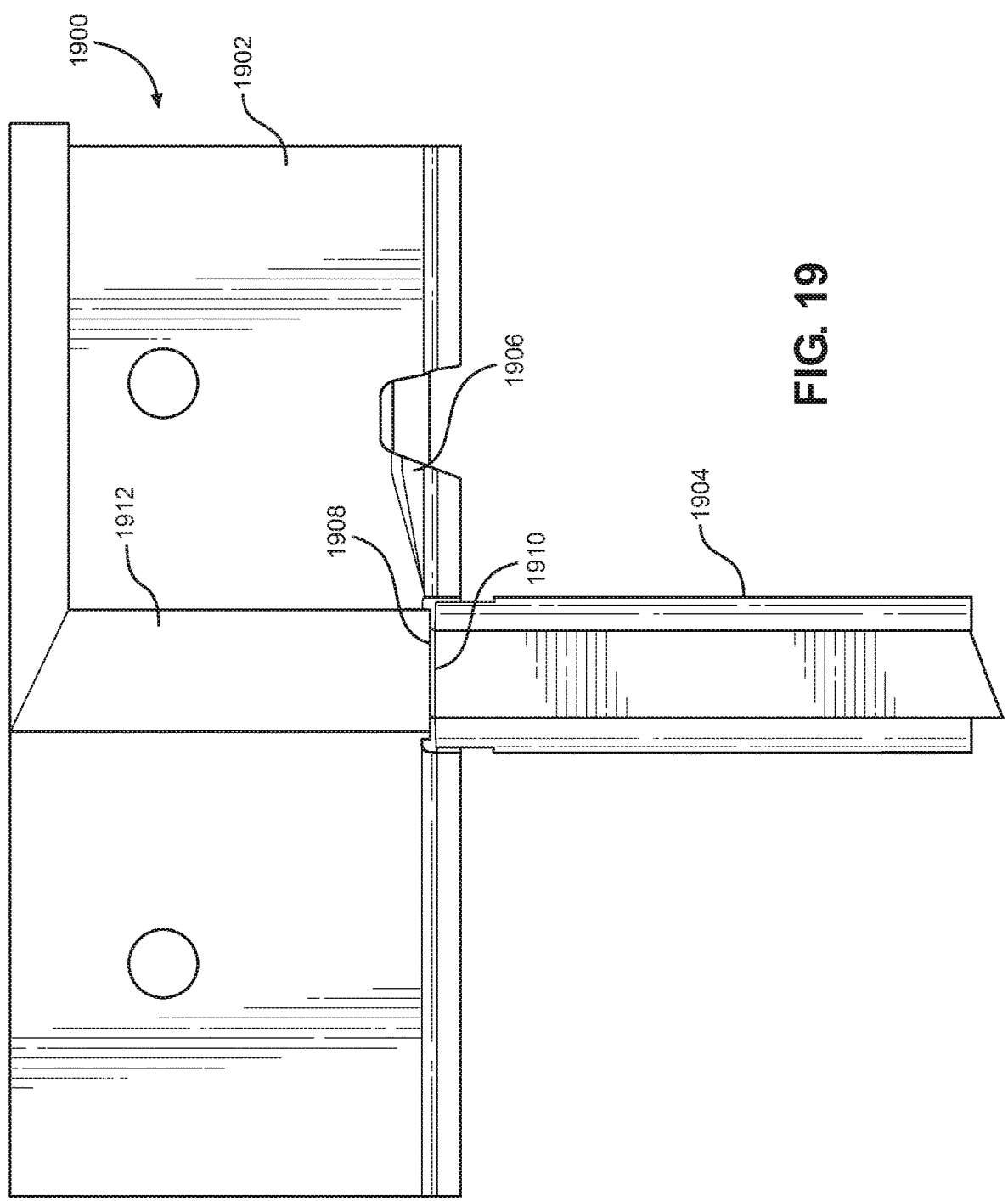
FIG. 19 illustrates another example dual-piston apparatus with spring pins, constructed in accordance with the present disclosure.

FIG. 19 illustrates yet another example compression mold apparatus 1900. In this embodiment, the apparatus 1900 comprises an upper mold portion 1902 and a lower mold portion 1904. In various embodiments, the upper mold portion 1902 comprises a gate 1906 that feeds the mold cavity by hot sprue or hot runner injection to allow overmolding material to flow behind an ingot 1910, forcing the overmolding material to an inner core side. In some embodiments, an upper piston 1912 comprises spring actuated pins, such as pin 1908 that hold the ingot 1910 in place (in conjunction with pins on a lower piston). The spring loaded pinch pins will hold the ingot 1910 in place until the overmolding material forces the material of the ingot 1910 to core sides and the materials solidify. To be sure, the overmolding material is forced downwardly towards a cavity side of the apparatus 100 due to pressure required for overmolding of the ingot 1910. After the ingot is compressed, the upper piston 1912 is slightly retracted prior to flowing the overmolding material into the apparatus and around the ingot. This configuration allows the overmolding material to force the ingot downwardly towards the core tool direction.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments were chosen and described in order to best explain the principles of the present technology and its practical application, and to enable others of ordinary skill in the art to understand the present technology for various embodiments with various modifications as are suited to the particular use contemplated.

Aspects of the present technology are described above with reference to flowchart illustrations and/or block diagrams of methods, apparatus (systems) and computer program products according to embodiments of the present technology. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Software") may be interchangeably used with its non-capitalized version (e.g., "software"), a plural term may be indicated with or without an apostrophe (e.g., PE's or PEs), and an italicized term (e.g., "N+1") may be interchangeably used with its non-italicized version (e.g., "N+1"). Such occasional interchangeable uses shall not be considered inconsistent with each other.

Also, some embodiments may be described in terms of "means for" performing a task or set of tasks. It will be understood that a "means for" may be expressed herein in terms of a structure, such as a processor, a memory, an I/O device such as a camera, or combinations thereof. Alternatively, the "means for" may include an algorithm that is descriptive of a function or method step, while in yet other embodiments the "means for" is expressed in terms of a mathematical formula, prose, or as a flow chart or signal diagram.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is noted at the outset that the terms "coupled," "connected", "connecting," "electrically connected," etc., are used interchangeably herein to generally refer to the condition of being electrically/electronically connected. Similarly, a first entity is considered to be in "communication" with a second entity (or entities) when the first entity electrically sends and/or receives (whether through wireline or wireless means) information signals (whether containing data information or non-data/control information) to the second entity regardless of the type (analog or digital) of those signals. It is further noted that various figures (including component diagrams) shown and discussed herein are for illustrative purpose only, and are not drawn to scale.

If any disclosures are incorporated herein by reference and such incorporated disclosures conflict in part and/or in whole with the present disclosure, then to the extent of conflict, and/or broader disclosure, and/or broader definition of terms, the present disclosure controls. If such incorporated disclosures conflict in part and/or in whole with one another, then to the extent of conflict, the later-dated disclosure controls.

The terminology used herein can imply direct or indirect, full or partial, temporary or permanent, immediate or delayed, synchronous or asynchronous, action or inaction. For example, when an element is referred to as being "on," "connected" or "coupled" to another element, then the element can be directly on, connected or coupled to the other element and/or intervening elements may be present, including indirect and/or direct variants. In contrast, when an element is referred to as being "directly connected" or "directly coupled" to another element, there are no intervening elements present.

Although the terms first, second, etc. may be used herein to describe various elements, components, regions, layers and/or sections, these elements, components, regions, layers and/or sections should not necessarily be limited by such terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be necessarily limiting of the disclosure. As used herein, the singular forms "a," "an" and "the" are intended to include the plural forms as well, unless the context clearly indicates otherwise. The terms "comprises," "includes" and/or "comprising," "including" when used in this specification, specify the presence of stated features, integers, steps, operations, elements, and/or components, but do not preclude the presence or addition of one or more other features, integers, steps, operations, elements, components, and/or groups thereof.

Example embodiments of the present disclosure are described herein with reference to illustrations of idealized embodiments (and intermediate structures) of the present disclosure. As such, variations from the shapes of the illustrations as a result, for example, of manufacturing techniques and/or tolerances, are to be expected. Thus, the example embodiments of the present disclosure should not be construed as necessarily limited to the particular shapes of regions illustrated herein, but are to include deviations in shapes that result, for example, from manufacturing.

Any and/or all elements, as disclosed herein, can be formed from a same, structurally continuous piece, such as being unitary, and/or be separately manufactured and/or connected, such as being an assembly and/or modules. Any and/or all elements, as disclosed herein, can be manufactured via any manufacturing processes, whether additive manufacturing, subtractive manufacturing and/or other any other types of manufacturing. For example, some manufacturing processes include three dimensional (3D) printing, laser cutting, computer numerical control (CNC) routing, milling, pressing, stamping, vacuum forming, hydroforming, injection molding, lithography and/or others.

Any and/or all elements, as disclosed herein, can include, whether partially and/or fully, a solid, including a metal, a mineral, a ceramic, an amorphous solid, such as glass, a glass ceramic, an organic solid, such as wood and/or a polymer, such as rubber, a composite material, a semiconductor, a nano-material, a biomaterial and/or any combinations thereof. Any and/or all elements, as disclosed herein, can include, whether partially and/or fully, a coating, including an informational coating, such as ink, an adhesive coating, a melt-adhesive coating, such as vacuum seal and/or heat seal, a release coating, such as tape liner, a low surface energy coating, an optical coating, such as for tint, color, hue, saturation, tone, shade, transparency, translucency, non-transparency, luminescence, anti-reflection and/or holographic, a photo-sensitive coating, an electronic and/or thermal property coating, such as for passivity, insulation, resistance or conduction, a magnetic coating, a water-resistant and/or waterproof coating, a scent coating and/or any combinations thereof.

Unless otherwise defined, all terms (including technical and scientific terms) used herein have the same meaning as commonly understood by one of ordinary skill in the art to which this disclosure belongs. The terms, such as those defined in commonly used dictionaries, should be interpreted as having a meaning that is consistent with their meaning in the context of the relevant art and should not be interpreted in an idealized and/or overly formal sense unless expressly so defined herein. Furthermore, relative terms such as "below," "lower," "above," and "upper" may be used herein to describe one element's relationship to another element as illustrated in the accompanying drawings. Such relative terms are intended to encompass different orientations of illustrated technologies in addition to the orientation depicted in the accompanying drawings. For example, if a device in the accompanying drawings is turned over, then the elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the example terms "below" and "lower" can, therefore, encompass both an orientation of above and below. While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method, comprising:
   placing a charge of conductive metal foam into a mold cavity of a first tool, wherein the first tool is located on a first portion of a compression molding apparatus, further wherein the mold cavity is defined by a lower surface that comprises a first plurality of pinch pins;
   translating the first portion of the compression molding apparatus into a second portion of the compression molding apparatus to compress the charge of the conductive metal foam, the second portion comprising a second plurality of pinch pins that align with the first plurality of pinch pins;
   wherein the second plurality of pinch pins and the first plurality of pinch pins compress and suspend the charge of the conductive metal foam; and
   introducing an overmolding material into a space created by suspension of the charge of the conductive metal foam, wherein the overmolding material saturates the charge of the conductive metal foam.

2. The method according to claim 1, wherein the lower surface is a terminal end of a piston.

3. The method according to claim 2, wherein the first tool is supported by the piston, wherein, upon being placed into the mold cavity, the charge of the conductive metal foam rests on the terminal end of the piston, the piston including a cam activated piston.

4. The method according to claim 1, further comprising creating a vacuum in the mold cavity within the compression molding apparatus during the step of introducing the overmolding material.

5. The method according to claim 1, wherein the first tool is supported by a fixed form member.

6. The method according to claim 1, further comprising flowing the overmolding material around and through the charge of the conductive metal foam during the step of introducing the overmolding material.

7. The method according to claim 1, wherein the charge of the conductive metal foam is only partially compressed during the translating to allow saturation of the charge of the conductive metal foam with the overmolding material during the step of introducing the overmolding material.

8. The method according to claim 1, wherein any of the first portion and the second portion of the compression molding apparatus comprises a protrusion that creates a feature in the charge of the conductive metal foam.

* * * * *